US006838878B2

(12) United States Patent
Saalwächter et al.

(10) Patent No.: US 6,838,878 B2
(45) Date of Patent: Jan. 4, 2005

(54) SOLID STATE NMR METHOD WITH INVERSE DETECTION

(75) Inventors: Kay Saalwächter, Freiburg (DE); Ingo Schnell, Mainz (DE); Manfred Hehn, Welterod (DE)

(73) Assignee: Max-Planck-Gesellschaft zur Förderung der Wissenschaften e.V., München (DE)

( * ) Notice: Subject to any disclaimer, the term of this patent is extended or adjusted under 35 U.S.C. 154(b) by 0 days.

(21) Appl. No.: 10/617,764

(22) Filed: Jul. 14, 2003

(65) Prior Publication Data

US 2004/0017194 A1 Jan. 29, 2004

(30) Foreign Application Priority Data

Jul. 25, 2002 (DE) .......................... 102 33 999

(51) Int. Cl.⁷ ............................... G01V 3/00
(52) U.S. Cl. ........................ 324/307; 324/309
(58) Field of Search ................. 324/307, 309, 324/314, 319, 322; 436/173; 128/653

(56) References Cited

U.S. PATENT DOCUMENTS

| | | | | |
|---|---|---|---|---|
| 5,117,186 A | * | 5/1992 | Burum et al. ............ | 324/307 |
| 5,245,284 A | * | 9/1993 | Burum et al. ............ | 324/321 |
| 5,926,023 A | * | 7/1999 | De Groot et al. ......... | 324/309 |
| 6,027,941 A | * | 2/2000 | Jarvie et al. ............. | 436/173 |
| 6,184,683 B1 | * | 2/2001 | Emsley et al. ........... | 324/309 |
| 6,653,832 B2 | * | 11/2003 | Wind et al. .............. | 324/307 |
| 6,670,811 B2 | * | 12/2003 | Wind et al. .............. | 324/307 |
| 6,674,282 B2 | * | 1/2004 | Pines et al. .............. | 324/307 |
| 2003/0210046 A1 | | 11/2003 | Wind | |

OTHER PUBLICATIONS

Mueller, L. *J. Am. Chem. Soc*, 1979, 101, 4481–4484.
Bodenhausen, G.; Ruben, D. *J. Chem. Phys. Lett.*, 1980, 69, 185–189.
Bax, A.; Griffey, R. R.; Hawkins, B. L. *J. Magn. Reson.* 1983, 55, 301–315.
Ishii, Y.; Tycko, R. *J. Magn. Reson.* 2000, 142, 199–204.
Schnell, I.; Langer, B.; Soentjens, S. H. M.; van Genderen, M. H. P.; Sijbesma, R. P.; Spiess, H. W. *J. Magn. Reson.*2001, 150, 57–70.
Goward, G. R.; Schnell, I.; Brown, S. P.; Spiess, H. W.; Kim, H.–D.; Ishida, H. *Magn. Reson. Chem.* 2001, 39, S5–S17.
Ishii, Y.; Yesinowski, J. P.; Tycko, R. *J. Am. Chem. Soc.* 2001, 123, 2921–2922.
Schmidt–Rohr, K.; Saalwaechter, K.; Liu, S.–F.; Hong, M.*J. Am. Chem. Soc.* 2001, 123, 7168–7169.
Hong, M.; Yamaguchi, S. *J. Magn. Reson.* 2001, 150, 43–48.
Sattler, M.; Schleucher, J.; Griesinger, C. *Progr. NMR Spectr.* 1999, 34, 93–158.

(List continued on next page.)

*Primary Examiner*—Brij B. Shrivastav
(74) *Attorney, Agent, or Firm*—Paul Vincent

(57) ABSTRACT

A solid-state nuclear magnetic resonance (NMR) method for investigating a sample material, which contains protons H and also spin-1/2 hetero nuclei X, uses a sample material rotated at the magic angle. The method comprises the steps of increasing the equilibrium polarization of X; eliminating (2) proton magnetization; transferring polarization from X to H; and recording the proton signals (8) under a condition of line narrowing. A radio frequency (RF) pulse sequence effects polarization transfer between X and the closest protons H, via dipole coupling with coupling constant $D_{XH}$. A parameter, which is associated with the transfer process, is varied to determine the dipole coupling constant $D_{XH}$ and thereby permits precise determination of the binding separation X—H, even when the concentration of X is small compared to H.

27 Claims, 2 Drawing Sheets

OTHER PUBLICATIONS

Saalwaechter, K.; Graf, R.; Spiess, H. W. *J. Magn. Reson.* 2001, 148, 398–418.

Zhao, X.; Sudmeier, J. L.; Bachovchin, W. W.; Levitt, M. H. *J. Am. Chem. Soc.* 2001, 123, 11097–11098.

Morris, G. A.; Freeman, R. *J. Am. Chem. Soc.* 1979, 101, 760–761.

Hing, A. W.; Vega, S.; Schaefer, J. *J. Magn. Reson.* 1992, 96, 205–209.

Graf, R.; Demco, D. E.; Gottwald, J.; Hafner, S.; Spiess, H. W. *J. Chem. Phys.* 1996, 106, 885–895.

Brown, S. P.; Schnell, I.; Brand, J. D.; Muellen, K.; Spiess, H. W. *J. Am. Chem. Soc.* 1999, 121, 6712.

Brown, S. P.; Zhu, X. X.; Saalwaechter, K.; Spiess, H. W. *J. Am. Chem. Soc.* 2001, 123, 4275–4285.

Schnell, I.; Spiess, H. W. *J. Magn. Reson.* 2001, 151, 153.

Fuess, H.; Hohlwein, D.; and Mason, S. A. *Acta Cryst.* 1977, B33, 654–659.

Fyfe, C. A.; Lewis, A. R. *J. Phys. Chem. B* 2000, 104, 48–55.

Bruno Alonso and Dominique Massiot; "Multi–scale NMR characterisation of mesostructured materials using 11–H–C through–bond polarisation transfer, fast MAS, and 1–H spin diffusion"; Journal of Magnetic Resonance, academic press, Orlando, FL, US Aug. 2003.

Pierre Reinheimer, Jerome Hirschinger, Pierre Granger, Philippe Breton, Alain Lagrange, Patrick Gilard, Marc Andree Lefebvre, and Noel Goetz, Cross–polarization/magic–angle–spinning nuclear magnetic resonance in selectively 13–C–labeled synthetic eumelanins; general subjects, Elsevier Science publishers, NL Oct. 1999.

\* cited by examiner

SOLID STATE NMR METHOD WITH INVERSE DETECTION

This application claims Paris Convention priority of DE 102 33 999.6 filed Jul. 25, 2002 the complete disclosure of which is hereby incorporated by reference.

BACKGROUND OF THE INVENTION

The invention concerns a solid state nuclear magnetic resonance (NMR) method for investigating a sample material which contains protons H and also spin-1/2 hetero nuclei X, wherein the sample material is rotated at the magic angle (MAS=magic angle spinning), the method comprising the following steps:
  a) increasing the equilibrium polarization of X;
  b) eliminating (2) proton magnetization;
  c) transferring polarization from X to H;
  d) recording the proton signals (8) under a condition of line narrowing;
wherein the sequence a) through d) is repeated several times.

A method of this type is disclosed by Y. Ishii, J. P. Yesinowski and R. Tycko, J. Am. Chem. Soc. 2001, 123, 2921–2922.

Nuclear magnetic resonance (NMR) spectroscopy has become one of the most powerful methods of analytical chemistry in the last decades. Elements with non-vanishing nuclear spin can be excited in an external magnetic field such that their magnetic moments precess. The associated precession frequency (resonance frequency) can be determined through irradiation and absorption of electromagnetic waves and depends on the environment of the analyzed nucleus. The NMR measurement therefore yields information about the binding partners of the nuclei examined and the binding separations between neighboring nuclei.

Numerous specific methods are used to increase the accuracy of NMR measurements, e.g. rotation of solid state samples at the magic angle.

X. Zhao, J. L. Sudmeier, W. W. Bachovchin and M. H. Levitt, J. Am. Chem. Soc. 2001, 123, 11097–11098 have proposed a method for precisely determining the binding separations between hydrogen and abundant amounts of a hetero nucleus having a nuclear spin 1/2 in the sample material. The method is based on hetero nuclear dipolar re-coupling using an $R18_2^5$ sequence. This method was used for $^{15}N-^1H$ groups with artificially enriched i.e. increased $^{15}N$ content. It is not suitable for hetero nuclei in small concentrations, e.g. $^{15}N$ in natural concentrations in a sample material.

The work by Ishii et al. 2001 loc. cit. presents investigations of $^{13}C$ in PMMA plastic materials. The method used therein is based on the indirect detection of $^{13}C$ magnetization via the hydrogen spectrum. A polarization transfer from H to $^{13}C$, elimination of H magnetization through two radio frequency (RF) pulses under a rotation resonance recoupling condition, and a qualitative transfer of polarization from $^{13}C$ back to H obtained pure correlation spectra of chemical shifts. Precise determination of binding separations is not possible with the method according to Ishii et al. 2001.

In contrast thereto, it is the underlying purpose of the present invention to provide a method for precise determination of binding separations between protons and a hetero nucleus with nuclear spin 1/2 which produces good results even for hetero nuclei concentrations, which are small, compared to that of protons, and which requires only a few hours of measuring time.

SUMMARY OF THE INVENTION

This object is achieved with an NMR method of the above-described type in that polarization is transferred from X to H in step c) with a radio frequency (RF) pulse sequence which effects transfer between the nuclei X and the spatially closest protons H utilizing the dipole coupling constant $D_{XH}$, wherein the transfer depends only weakly on couplings of nuclei X to more remote protons and on couplings among the protons, and the dipole coupling constant $D_{XH}$ is determined through variation of an experimental parameter which is unambiguously physically associated with the transfer process and through the resulting variation of the intensity of the respective proton signals recorded in step d).

Since the inventive method is an inverse detection method, it provides access to elements having only small contributions to the overall nuclear magnetization of the entire sample material e.g. in consequence of small concentration and/or small gyromagnetic ratio. With the inventive method, the polarization is transferred from X to H in a quantifiable, defined manner. This permits absolute determination of the binding separations between X and H. Evaluation of the NMR measurement may be basically effected in two ways:

1) suitable selection of the experimental parameter splits the NMR signal in the indirect dimension of a 2 or 3-dimensional spectrum into a sideband pattern whose intensity distribution permits calculation of the binding separation between X and H.
2) if another experimental parameter is selected, the intensity of a resonance maximum varies with incrementation and the binding separation can be calculated from the intensity dependence.

Towards this end, the measured data is fit to a theoretically derived formula. If the formulae are very complex, evaluation may occur through comparison of the measured data with a one-time calculated pattern curve which takes into consideration the calibration in case of deviations from the idealized theory, e.g. due to experimental inaccuracies.

One inventive method variant is preferred wherein the ratio between H nuclei and X nuclei is larger or equal to 10:1, in particular larger or equal to 100:1. This facilitates NMR spectra even after considerable thinning or depletion of X in the sample material. The minimum requirements concerning the concentration of the hetero nucleus in the inventive method are thereby particularly beneficial.

In another variant of the inventive method, the X nuclei are present in a natural occurrence in the sample. In this case, sample preparation such as isotope marking can be omitted. In particular, the invention permits straightforward useful measurement of a low-molecular content sample having natural $^{15}N$ content (approximately 0.3% of all N).

One inventive method variant is particularly advantageous wherein the X nuclei have a gyromagnetic ratio of $\gamma(X) \leq \gamma(^{13}C)$. The principle of indirect detection of polarization of X nuclei avoids problems due to intrinsically weak NMR signals in consequence of a low gyromagnetic ratio for X.

One inventive method variant is also preferred in which the X nuclei comprise $^{15}N$. N is an important component in biochemistry and the properties of N—H compounds, in particular for peptide compounds, are of great interest to investigations of metabolic processes. $^{15}N$ is a natural isotope with an abundance of only 0.3% and a nuclear spin 1/2.

In another method variant, the X nuclei preferably comprise $^{13}C$. Carbon is contained in all organic and biochemical compounds and $^{13}C$ is a natural carbon isotope of nuclear spin 1/2 and is present in a concentration of approximately 1%. This variant permits structural analysis in organic chemistry.

Finally, in accordance with the invention, the X nuclei may also comprise $^{29}$Si. Si is a basic component in numerous plastic materials such as silicone and is also important for high-temperature-resistant ceramics. The inventive method may also be used in these fields for determining the structure and properties.

In a preferred variant of the inventive method, a polarization transfer from H to X is effected in step a). This represents the standard procedure to increase the polarization of X beyond the natural equilibrium polarization thereof.

In a particularly simple method variant, a cross-polarization is used in step a). Cross-polarization is a widely used standard method in NMR to transfer polarization, in particular from H to X.

In another advantageous inventive method variant, a field gradient pulse is applied in step b). This reduces the length of the phase cycle of the experiment, i.e. the number of repetitions of the step sequence a) through d) and therefore the overall duration of the experiment.

In an alternative method variant, two radio frequency pulses can be applied in step b) under the rotary resonance recoupling condition. This variant can be used to generate a gradient field without expensive laboratory equipment.

One variant of the inventive method is also preferred with which the chemical shift of the X nuclei is encoded under proton decoupling during a time interval $t_1$ (as is known in the art) between steps b) and c).

One method variant is particularly preferred which is characterized in that a TEDOR/REPT sequence is applied in step c), wherein the time interval $t_1'$ is an experimental parameter which is unambiguously physically associated with the transfer process and which is used between the 90° pulse on X and the 90° pulse on H for encoding the dipole coupling constants $D_{XH}$. This is a particularly robust method requiring only relatively rough adjustment of the measuring parameters. In particular, the measurement results from which a sideband pattern is obtained after Fourier transformation can be interpreted in a relatively simple fashion. The TEDOR/REPT sequence is labeled in FIG. 1 with reference numerals 4 through 6.

In one embodiment of the two above-mentioned method variants, the step sequence a) through d) is carried out several times in succession, wherein $t_1$ and $t_1'$ are incremented simultaneously, in particular with different time increments. This embodiment avoids distribution of the measurements within a three-dimensional space. The sideband patterns are folded in the X dimension.

An alternative of the above method variants is characterized in that a TEDOR/REPT sequence is applied in step c), wherein the time interval $t_1'$ between the 90° pulse on X and the 90° pulse on H is fixed and the number of rotor-synchronized 180° pulses is varied as the experimental parameter which is unambiguously physically associated with the transfer process, wherein the intensities of the obtained spectra associated with different numbers of rotor-synchronized 180° pulses are used to determine the dipole coupling constant $D_{XH}$. In this variant, only the intensity variations of the NMR signals are analyzed. Since analysis of the sideband patterns is not required, the evaluation is relatively simple.

In another alternative of the above method variant, a TEDOR/REPT sequence is applied in step c), wherein the time interval $t_1'$ between the 90° pulse on X and the 90° pulse on H is fixed and a time distance between the rotor-synchronized 180° pulses on X relative to the rotor-synchronized 180° pulses on H is varied as the experimental parameter which is unambiguously physically associated with the transfer process, wherein the dipole coupling constants $D_{XH}$ are determined from the spectra obtained for various time intervals. This variant is also very robust and insensitive to disturbances and produces results, which are easy to interpret.

One embodiment of this method variant is characterized in that the step sequence a) through d) is carried out several times in succession, wherein both $t_1$ and the time interval between the rotor-synchronized 180° pulses on X relative to the rotor-synchronized 180° pulses on H are simultaneously incremented, in particular with different time increments. This embodiment also avoids a three-dimensional measurement space and sideband patterns are also obtained which are folded in the X dimension.

In a last alternative of the above-mentioned method variant, the transfer in step c) is effected by a Lee-Goldburg cross-polarization whose duration is varied as the experimental parameter which is unambiguously physically associated with the transfer process. In this manner, highly accurate spectra can be obtained with only a slightly increased experimental effort compared to the above-mentioned alternatives.

In an advantageous variant of the inventive method, rapid rotation at the magic angle is applied in step d) only with a rotation frequency which is larger or equal to 25 kHz (Fast MAS). Fast MAS is a very simple standard method to increase the measurement accuracy, wherein no RF pulses must be irradiated and only small amounts of sample material are used.

One alternative method variant provides application of slow rotation at the magic angle supported by radio frequency pulses in step d). This variant permits use of larger sample amounts and therefore an increase in the signal intensity.

In a further inventive method variant, rotation at the magic angle, supported by pulsed spin locking is applied in step d). This leads to very narrow lines in the proton spectrum, thereby increasing the speed of measurement and the measurement intensity.

One method variant is particularly preferred with which X—H binding separations are determined, in particular of hydrogen bridges. Determination of the binding separations via NMR is much less expensive than all alternative methods of prior art such as e.g. neutron scattering.

One inventive method variant is also preferred with which a peptide chain structure is determined. The structure of the peptide chain provides information about the function of the peptide chain (e.g. the catalytic effect of an enzyme) thereby permitting investigation of the biochemical processes.

Further advantages of the invention can be extracted from the description and the drawing. The features mentioned above and below can be used in accordance with the invention either individually or collectively in arbitrary combination. The embodiments shown and described are not to be understood as exhaustive enumeration but rather have exemplary character for describing the invention.

The invention is shown in the drawing and explained in more detail with reference to embodiments.

DESCRIPTION OF THE PREFERRED EMBODIMENT

Figure 1:
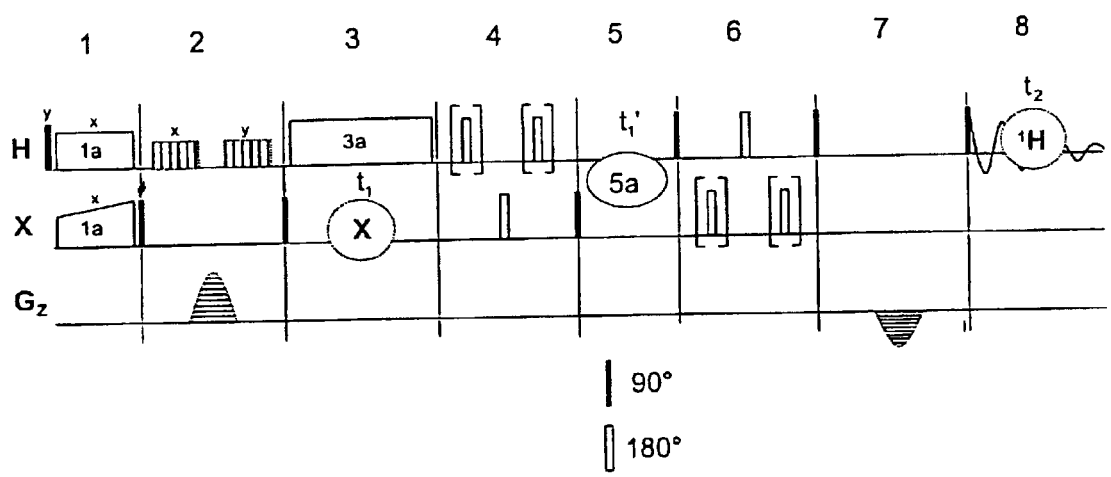
FIG. 1 shows an inventive pulse sequence for $^1$H detected $^{15}$N—$^1$H correlation NMR spectroscopy with fast MAS for solid-state samples.

The invention was tested by experiments to determine $^{15}$N—$^1$H binding lengths in natural abundance samples by means of inverse detection in solid-state NMR spectroscopy with fast MAS.

A $^{15}$N—$^1$H solid state correlation NMR experiment is provided which considerably increases the signal sensitivity by inverse $^1$H detection and fast MAS to permit precise determination of NH binding lengths via hetero nuclear $^1$H—$^{15}$N dipole-dipole couplings for samples having $^{15}$N in natural abundance. Pulsed field gradients or, alternatively, radio frequency pulses provide adequate suppression of undesired $^1$H signals. This method permits routine application of $^{15}$N—$^1$H correlation NMR spectroscopy for solid state samples having natural isotope abundances in an experiment lasting a few hours. The dipolar coupling constants are determined from rotation sideband patterns, which are generated in the spectra by recently developed recoupling techniques. The information about $^{15}$N/$^1$H chemical shifts and quantitative $^{15}$N—$^1$H couplings can be directly combined in a "split-$t_1$" approach.

Sensitivity increase by $^1$H inverse detection[1] is almost universally used today in hetero nuclear multi-dimensional NMR experiments to determine the structure of molecules in solution. For solid state samples, the increase in $^1$H resolution under fast magic angle spinning (MAS) has recently proven to be sufficient to overcome the main obstacle of inverse detection in solid state samples, namely the width of the $^1$H lines[2]. Substantial sensitivity increases were reported for a series of $^{15}$N and $^{13}$C systems[2]-[4]. Certain pulse sequences and detection variants guarantee high $^1$H resolution and also permit high sensitivity increases in inversely detected static $^2$H and $^{15}$N powder spectra[5]-[6]. Inverse detection techniques are subject to particular challenges if small isotopic concentrations are to be observed, since incomplete suppression of the large excess magnetization of uncoupled $^1$H nuclei can produce serious signal artifacts. Pulsed field gradients (PFGs) are a conventional NMR technique to eliminate undesired coherences in solutions[7]. For solid state samples, it has been shown that radio frequency (RF) pulses, which utilize strong dipole-dipole couplings, can achieve the same results without requiring special spectrometer equipment[4].

This invention presents two-dimensional $^{15}$N—$^1$H correlation NMR experiments, which are carried out with inverse $^1$H detection and fast MAS on samples having $^{15}$N in natural abundance. PFGs or alternatively RF pulses suppress the undesired $^1$H signal and 2D spectra can be recorded experimentally within a few hours. We show for the first time that hetero nuclear $^1$H—$^{15}$N dipole-dipole couplings and therefore reliable binding lengths for $^{15}$N of natural occurrence can be determined from rotary sideband patterns which are generated by a recently developed dipolar recoupling technique[8]. The great importance of high-precision determinations of N—H binding lengths through solid state NMR in view of characterization of hydrogen bridge compounds was recently pointed out[9]. In our $^{15}$N—$^1$H spectra, the information about (i) chemical shift and (i) dipole-dipole couplings/binding lengths can be obtained either independently of each other or in combination (by a "split-$t_1$" approach).

The inventive method is based on the connection between two solid state NMR techniques which initially effect an incoherent and then a coherent polarization transfer between $^1$H and $^{15}$N (FIG. 1). Initial $^1$H polarization is transferred incoherently to $^{15}$N through conventional cross-polarization (CP). Subsequently, the final (inverse) detection of the weak $^{15}$N signal on $^1$H is facilitated by effectively removing strong $^1$H residual polarization using a field gradient pulse (with a length of 100 $\mu$s) or with two RF pulses (having a length of 400 $\mu$s each and under rotary resonance conditions)[4] while the $^{15}$N polarization remains stored in a longitudinal state. The performance of both dephasing techniques was comparable in practice.

Due to this pre-selection, the desired coherence path (i.e. $^1$H→$^{15}$N→$^1$H) can be selected by a four-stage phase cycle and increased to a total of 16 or 32 stages for complete purification of the signal. While RF pulses for dephasing can be directly applied using standard NMR equipment, PFGs require installation of gradient coils at the top and bottom of the MAS stator. The $^{15}$N signal is finally returned to $^1$H for detection via a coherent TEDOR recoupling step[8],[10] thereby permitting measurement of the $^{15}$N—$^1$H coupling.

Two independent spectral dimensions can be incorporated in this CP-TEDOR transfer scheme, one dipolar decoupled (DD) $^{15}$N dimension ($t_1$) between the two transfer blocks and a $t_1'$ dimension in the center of the TEDOR sequence. While the first provides access to chemical shift information via $^{15}$N, the latter produces modulation of a dipolar arranged state through recoupling. This method of "rotor encoding" has already been suggested in another homo[11] and hetero nuclear[8] correlation experiment. The coupling information can be obtained from the $t_1'$ modulation of the detected signal which is converted into a side band pattern by means of Fourier transformation. These patterns greatly depend on the product of recoupling time and coupling strength.[8]

Figures 2A, 2B, 2C, 2D:
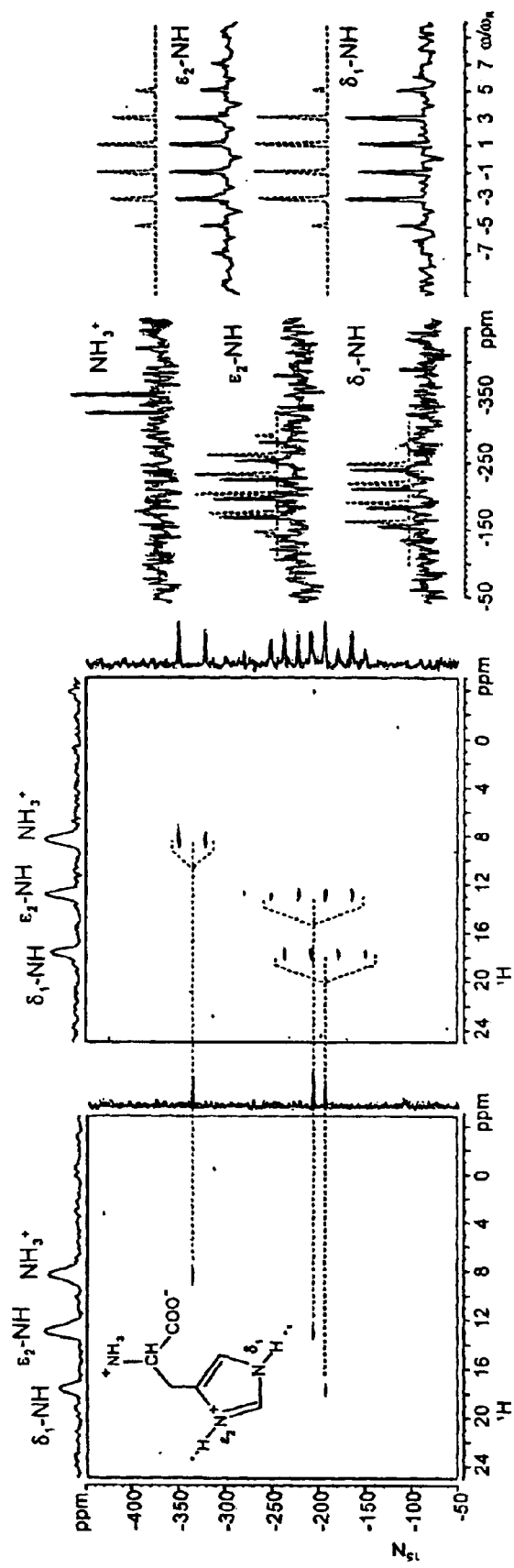
FIG. 2a shows a $^{15}$N correlation spectrum of L-Histidin.HCl.H$_2$O, recorded with an inventive method in accordance with FIG. 1 with dephasing RF pulses and 30 kHz MAS.
FIG. 2b shows a spectrum of the same sample material as in FIG. 2a, recorded with an inventive method in accordance with FIG. 1 with pulsed field gradient.
FIG. 2c shows three cuts through the spectrum of FIG. 2b along the $^{15}$N dimension.
FIG. 2d shows pure rotor-encoded sideband patterns, recorded with an inventive method for incremented $t_1'$ and constant $t_1=0$ with dephasing RF pulses.

FIG. 2a shows a $^{15}$N—$^1$H correlation NMR spectrum of L-Histidin.HCl.H$_2$O, which was recorded in a 2.5 mm rotor system at 30 kHz MAS. Unfortunately, the use of small rotors is absolutely necessary and this limits the technique, in samples having natural isotope abundance, to smaller molecules due to the small sample amounts. Fast MAS is essential for an efficient and quantifiable TEDOR transfer.[8]

An alternative possibility is the use of a Lee-Goldburg cross-polarization instead of the TEDOR/REPT transfer in connection with multi-pulse supported $^1$H acquisition in $t_2$ (step 8) thereby also permitting determination of binding lengths with systems using larger rotors with slower rotation.

Nevertheless, only 8192 runs of the pulse sequence of FIG. 1 were required for recording the full 2D spectrum in FIG. 2a. To obtain a pure correlation spectrum of the chemical shifts, $t_1$ was incremented in steps of full rotor periods ($\tau_R$) without rotor encoding ($t_1'=0$). In this fashion, $^{15}$N—$^1$H correlation spectra can be recorded in their natural concentrations within 4 to 10 hours, which also permits routine use of the technology for solid state samples. The inversely detected CP-TEDOR technique provides a sensitivity gain[2] of a factor between 6 and 8 compared to the analog $^{15}$N detected conventional 2D TEDOR experiment.

The spectrum of FIG. 2a contains all three expected NH correlation signals when the $^{15}$N—$^1$H couplings are recoupled for a duration of 2×6$\tau_R$ in the TEDOR step. For shorter recoupling periods (<2×4$\tau_R$) the signal of the fast rotating $NH_3^+$ groups vanishes due to the weaker coupling. The rotary sideband pattern, which is introduced into the spectra by incrementing $t_1'$ in steps of $\tau_R$/N simultaneously with $t_1$ ("split-$t_1$" approach), permits precise measurement of the couplings. The total number N determines the splitting width $\Delta\nu$ of the (uneven) sideband configurations in the spectra in accordance with $\Delta\nu=2\nu_R/N$, wherein $\nu_R$ is the MAS frequency. The spectrum of FIG. 2b was recorded with N=30. Dipolar recoupling was applied in the TEDOR step for a duration of 2×6$\tau_R$. $^{15}N$—$^1H$ couplings in the region of $D_{NH}/2\pi$>2 kHz can be determined which corresponds to N—H separations of up to 180 pm. Since the signal is distributed over a pattern in the "split-$t_1$" experiment, 5 to 10 times more signal accumulations are required compared to the pure shift correlation experiment.

If the $^{15}N$ shift information is not required, the $t_1$ dimension can be omitted and a purely rotor-encoded signal in the $t_1'$ dimension can be recorded. FIG. 2d shows the sideband patterns which are observed for the $\delta_1$-NH and the $\epsilon_2$-NH for ~18 ppm or ~13 ppm in the $^1H$ spectrum. A total of 20480 experiment runs (2.5 times more than for the spectrum of FIG. 2a) were used for the recording. The N—H separations determined from these patterns agree with results of earlier investigations,[9],[12] (see table 1). Besides the usual overestimation of the separations in NMR,[9] a further systematic deviation is to be expected due to the influence of couplings of $^{15}N$ to additional protons. The separations can nevertheless be reliably determined even when the disturbing coupling is ~30% of the main coupling[8]. It is to be noted that, in a system in which many protons couple with one single $^{15}N$ core, the technique only provides access to the dominant (strongest) coupling. Two or more couplings of similar strength produce destructive interferences during recoupling and therefore signal losses.[8],[13]

TABLE 1

N-H dipole-dipole couplings ($D_{NH}$) and separations ($r_{NH}$),
which are measured by NMR sideband patterns (FIGS. 2c and 2d). Data of
earlier measurements by solid state NMR and neutron scattering on
L-Histidin.HCl.H$_2$O are listed for comparison.[9],[12]

| $^1H$ Signal | $D_{NH}/2\pi$ [kHz] | This work $r_{NH}$ [pm] | NMR $r_{NH}$ [pm] | Scattering $r_{NH}$ [pm] |
|---|---|---|---|---|
| ~13 ppm (c) | 9.4 ± 0.9 | 109 ± 4 | 105 ± 5 | 102.6 ± 0.4 |
| ($\epsilon_2$) (d) | 9.9 ± 0.5 | 107 ± 2 | | |
| ~18 ppm (c) | 8.2 ± 0.9 | 114 ± 4 | 109 ± 5 | 107.0 ± 0.4 |
| ($\delta_1$) (d) | 8.85 ± 0.5 | 111 ± 2 | | |

In summary, one expects a wide range of applications for these and related[4],[6] inverse $^1H$ detection techniques, since they provide information about dipolar couplings (i.e. binding lengths) together with chemical shift resolution in samples having $^{15}N$ in natural abundance. This technique is particularly important for investigations of N—H . . . N and N—H . . . O hydrogen bridges. With regard to biomolecules, the sensitivity increase for $^{15}N$ in combination with $^{15}N$—$^1H$ coupling information will be substantially helpful to improve NMR experiments for determining the structure of solid state peptide main chains. Further technical developments, in particular optimization of the $^1H$ RF oscillating circuit for detection are expected to further increase the signal sensitivity and therefore the practical importance of $^1H$ detected solid state NMR experiments.

FIG. 1 shows an inventive pulse sequence for $^1H$ detected $^{15}N$—$^1H$ correlation NMR spectroscopy in fast solid state MAS. The time is plotted on the right-hand side; pulse sequences on H, X and gradient pulses in the z direction $G_z$ are indicated on three lines. Black and white (not filled in) bars represent 90° and 180° pulses, respectively. The alternative possibilities to suppress excessive $^1H$ magnetization are shown with horizontal hatches (PFGs) and vertical hatches (dephasing RF pulses).

In the time interval 1, cross-polarization is carried out with corresponding sequences 1a on H and X followed by dephasing in the time interval 2. During the time interval $t_1$, marked with reference numeral 3, the dipolar decoupling 3a and encoding of the $^{15}N$ chemical shift takes place followed by the time intervals 4, 5 and 6, which, together, form the TEDOR/REPT sequence. A first recoupling takes place in the time interval 4. The pulses in square brackets can thereby be repeated several times in time periods of half a rotor period. Rotor encoding 5a takes place in the time interval $t_1'$, marked with reference numeral 5, followed by a second recoupling in the time interval 6, wherein the pulses in square brackets may be repeated. The time interval 7 marks a dephasing step and the proton signals are recorded in the time interval 8.

FIG. 2a shows a $^{15}N$—$^1H$ correlation spectrum of L-Histidin.HCl.H$_2$O recorded with 30 kHz MAS in a 16.4 T magnet (700 MHz $^1H$ Larmor frequency) with a recoupling time of 2×6$\tau_R$ and signal accumulation of 8192 experiment runs of the pulse sequence of FIG. 1 (with RF dephasing pulses and $t_1'$=0). The chemical shifts of $^1H$ and $^{15}N$ are plotted towards the right-hand and upper side. FIG. 2b shows the same spectrum as FIG. 2a but with PFG dephasing and dipolar rotary sideband patterns in the $^{15}N$ dimension recorded by simultaneous incrementation of $t_1$ and $t_1'$ in steps $\tau_R$ and $\tau_R/30$, respectively. FIG. 2c shows cuts through FIG. 2b along the $^{15}N$ dimension with the corresponding $^1H$ positions. FIG. 2d shows a purely rotor-encoded sideband pattern recorded by incrementation of $t_1'$ with $t_1$=0 (using RF dephasing pulses). Calculated patterns are shown in FIGS. 2c and 2d with finely dotted lines above the experimentally determined patterns. The N—H dipole-dipole couplings and N—H separations determined from the patterns are listed in table 1.

Literature 1. (a) Müller, *J. Am. Chem. Soc,* 1979, 101, 4481–4484.
   (b) Bodenhausen, G.; Ruben, D. J. *Chem. Phys. Lett.,* 1980, 69, 185–189.
   (c) Bax, A.; Griffey, R. R.; Hawkins, B. L. *J. Magn. Reson.* 1983, 55, 301–315.
2. (a) Ishii, Y.; Tycko, R. *J. Magn. Reson.* 2000, 142, 199–204.
   (b) Schnell, I.; Langer, B.; Söntjens, S. H. M.; van Genderen, M. H. P.; Sijbesma, R. P.; Spiess, H. W. *J. Magn. Reson.* 2001, 150, 57–70.
3. Goward, G. R.; Schnell, I.; Brown, S. P.; Spiess, H. W.; Kim, H.-D.; Ishida, H. *Magn. Reson. Chem.* 2001, 39, S5–S17.
4. Ishii, Y.; Yesinowski, J. P.; Tycko, R. *J. Am. Chem. Soc.* 2001, 123, 2921–2922.
5. Schmidt-Rohr, K.; Saalwächter, K.; Liu, S.-F.; Hong, M. *J. Am. Chem. Soc.* 2001, 123, 7168–7169.
6. Hong, M.; Yamaguchi, S. *J. Magn. Reson.* 2001, 150, 43–48.
7. Sattler, M.; Schleucher, J.; Griesinger, C. *Progr. NMR Spectr.* 1999, 34, 93–158.
8. Saalwächter, K.; Graf, R.; Spiess, H. W. *J. Magn. Reson.* 2001, 148, 398–418.

9. Zhao, X.; Sudmeier, J. L.; Bachovchin, W. W.; Levitt, M. H. *J. Am. Chem. Soc.* 2001, 123, 11097–11098.

10. (a) Morris, G. A.; Freeman, R. *J. Am. Chem. Soc.* 1979, 101, 760–761.
(b) Hing, A. W.; Vega, S.; Schaefer, J. *J. Magn. Reson.* 1992, 96, 205–209.

11. (a) Graf, R.; Demco, D. E.; Gottwald, J.; Hafner, S.; Spiess, H. W. *J. Chem. Phys.* 1996, 106, 885–895.
(b) Brown, S. P.; Schnell, I.; Brand, J. D.; Müllen, K.; Spiess, H. W. *J. Am. Chem. Soc.* 1999, 121, 6712.
(c) Brown, S. P.; Zhu, X. X.; Saalwächter, K.; Spiess, H. W. *J. Am. Chem. Soc.* 2001, 123, 4275–4285.
(d) Schnell, I.; Spiess, H. W. *J. Magn. Reson.* 2001, 151, 153.

12. Fuess, H.; Hohlwein, D.; and Mason, S. A. *Acta Cryst.* 1977, B33, 654–659.

13. Fyfe, C. A.; Lewis, A. R. *J. Phys. Chem. B* 2000, 104, 48–55.

We claim:

1. A solid state nuclear magnetic resonance (NMR) method for investigating a sample material that contains protons H and also spin-1/2 hetero nuclei X, the method comprising the steps of:
   a) increasing an equilibrium polarization of X;
   b) suppressing proton magnetization;
   c) transferring polarization from X to H using a radio frequency (RF) pulse sequence which effects transfer between the nuclei X and spatially proximate protons H utilizing a dipole coupling constant $D_{XH}$, wherein polarization transfer depends only weakly on couplings of nuclei X to spatially distant protons and only weakly on couplings among the protons themselves;
   d) recording proton signals under a line narrowing condition, wherein the sample material is rotated at a magic angle (MAS=magic angle spinning);
   e) repeating steps a) through d) several times while varying an experimental parameter which is clearly physically associated with a polarization transfer process; and
   f) determining a dipole coupling constant $D_{XH}$ by analyzing variations in intensity of proton signals recorded in step d), wherein a ratio between a number of H nuclei to a number of X nuclei is larger than or equal to 10:1.

2. The method of claim 1, wherein said ratio is larger than or equal to 100:1.

3. The method of claim 1, wherein the X nuclei in the sample have natural abundance.

4. The method of claim 1, wherein the X nuclei have a gyromagnetic ratio of $\gamma(X) \leq \gamma(^{13}C)$.

5. The method of claim 1, wherein the X nuclei comprise $^{15}N$.

6. The method of claim 1, wherein the X nuclei comprise $^{13}C$.

7. The method of claim 1, wherein the X nuclei comprise $^{29}Si$.

8. The method of claim 1, wherein a polarization transfer from H to X is effected in step a).

9. The method of claim 1, wherein a cross-polarization is applied in step a).

10. The method of claim 1, wherein a field gradient pulse is applied in step b).

11. The method of claim 1, wherein two radio frequency pulses are applied in step b) having a rotary resonance recoupling condition.

12. The method of claim 1, wherein a chemical shift of the X nuclei is encoded between steps b) and c) under proton decoupling in a time interval $t_1$.

13. The method of claim 1, wherein a TEDOR/REPT sequence is applied in step c), with a time interval $t_1'$ being an experimental parameter which is clearly physically associated with the transfer process, said time interval $t_1'$ being used between a 90° pulse on X and a 90° pulse on H for encoding the dipole coupling constant $D_{XH}$.

14. The method of claim 12, wherein a TEDOR/REPT sequence is applied in step c), with a time interval $t_1'$ being an experimental parameter which is clearly physically associated with the transfer process, said time interval H being used between a 90° pulse on X and a 90° pulse on H for encoding the dipole coupling constant $D_{XH}$.

15. The method of claim 14, wherein steps a) through d) are carried out several times in succession, wherein $t_1$ and $t_1'$ are simultaneously incremented.

16. The method of claim 15, wherein $t_1$ and $t_1'$ are incremented with different time increments.

17. The method of claim 1, wherein a TEDOR/REPT sequence is applied in step c), wherein a time interval $t_1'$ between a 90° pulse on X and a 90° pulse on H is fixed and a number of rotor-synchronized 180° pulses is varied as an experimental parameter which is clearly physically associated with a polarization transfer process, wherein intensities in resulting spectra for different numbers of rotor-synchronized 180° pulses are used to determine dipole coupling constants $D_{XH}$.

18. The method of claim 1, wherein a TEDOR/REPT sequence is applied in step c), and a time interval $t_1'$ between a 90° pulse on X and a 90° pulse on H is fixed and a time difference between rotor-synchronized 180° pulses on X relative to rotor-synchronized 180° pulses on H is varied as an experimental parameter which is clearly physically associated with a polarization transfer process, wherein dipole coupling constants $D_{XH}$ are determined from spectra extracted for different time differences.

19. The method of claim 18, wherein a chemical shift of the X nuclei is encoded between steps b) and c) under proton decoupling in a time interval $t_1$ and steps a) through d) are carried out several times in succession, wherein both $t_1$ and a time difference between the rotor-synchronized 180° pulses on X and rotor-synchronized 180° pulses on H are simultaneously incremented.

20. The method of claim 19, wherein $t_1$ and said time difference are incremented with different time increments.

21. The method of claim 1, wherein transfer in step c) is effected by a Lee-Goldburg cross-polarization whose time duration is varied as an experimental parameter which is clearly physically associated with a polarization transfer process.

22. The method of claim 1, wherein rapid rotation at the magic angle with a rotation frequency which is larger than or equal to 25 kHz (fast MAS) is only effected in step d).

23. The method of claim 1, wherein rotation at the magic angle is supported by radio frequency pulses in step d).

24. The method of claim 1, wherein rotation at the magic angle is supported by pulsed spin locking in step d).

25. The method of claim 1, wherein the method determines X—H binding separations.

26. The method of claim 25, wherein said binding separations are of hydrogen bridges.

27. The method of claim 1, wherein the method is applied to determine a structure of a peptide chain.

* * * * *